United States Patent [19]
Tipon et al.

[11] Patent Number: 4,825,106
[45] Date of Patent: Apr. 25, 1989

[54] MOS NO-LEAK CIRCUIT

[75] Inventors: Donald G. Tipon, San Diego; Chinh V. Tran, Escondido, both of Calif.

[73] Assignee: NCR Corporation, Dayton, Ohio

[21] Appl. No.: 35,842

[22] Filed: Apr. 8, 1987

[51] Int. Cl.[4] .................. H03K 19/017; H03K 3/037; H03K 19/094

[52] U.S. Cl. .................................. 307/451; 307/443; 307/475; 307/585

[58] Field of Search .............. 307/443, 451, 475, 554, 307/568, 562, 579, 585, 576, 594, 297, 296 R

[56] References Cited

U.S. PATENT DOCUMENTS

| | | | |
|---|---|---|---|
| 3,914,702 | 10/1975 | Gehweiler | 307/451 |
| 4,469,959 | 9/1984 | Luke et al. | 307/475 |
| 4,518,873 | 5/1985 | Suzuki et al. | 307/451 |
| 4,555,642 | 11/1985 | Morales | 307/475 |
| 4,567,385 | 1/1986 | Falater et al. | 307/451 |
| 4,584,491 | 4/1986 | Ulmer | 307/475 |
| 4,593,212 | 6/1986 | Svager | 307/475 |
| 4,633,107 | 12/1986 | Norsworthy | 307/594 |
| 4,675,544 | 6/1987 | Schrenk | |

Primary Examiner—Stanley D. Miller
Assistant Examiner—Timothy P. Callahan
Attorney, Agent, or Firm—Wilbert Hawk, Jr.; Edward Dugas

[57] ABSTRACT

A CMOS inverter circuit is coupled to a power source by a cut-off circuit which prevents current flow through the CMOS inverter circuit when the input signal to the CMOS inverter is of a first bi-level state. The cut-off circuit responds to the output signal from a second inverter circuit that is connected to receive the output of the CMOS inverter circuit. A second embodiment of the invention provides a latching function by connecting a feedback path from the output of the second inverter circuit to a toggle gate circuit connected to the input to said CMOS inverter circuit.

6 Claims, 3 Drawing Sheets

MOS NO-LEAK CIRCUIT

BACKGROUND OF THE INVENTION

A phenomenon of current leakage occurs in CMOS inverter circuits when driven with an NMOS transfer gate. The phenomenon is related to the fact that the P channel transistor portion of the CMOS inverter does not receive an adequate amount of gate voltage for completely cutting off the channel when the logic level to the input of the transfer gate is in the 1 state. This small amount of leakage current is multiplied many times within an integrated circuit chip by the usage of a multiplicity of CMOS inverters.

One patent of particular interest in U.S. Pat. No. 4,593,212 entitled, "TTL to CMOS Input Buffer" by Ysvager, wherein there is disclosed a buffer circuit utilizing a CMOS inverter wherein the P channel transistor is provided with a relatively low gain so that there is very little current flow through the inverter when the input signal to the buffer is at a low voltage logic high. Aside from the selection of the low gain for one of the CMOS transistors a switch is coupled between the power supply and the output of the buffer such that the switch couples the full power supply voltage to the output of the CMOS inverter when the input signal is switching from a logic high to a logic low.

Another patent of interest for it's showing of the prevention of excessive current flow through a CMOS inverter during its switching from one logic state to another is U.S. Pat. No. 4,518,873 entitled, "Buffer Circuit for Driving a C-MOS Inverter", by Ysuzuki et al. In the preferred embodiment of this patent, a CMOS inverter is driven by a buffer circuit. A first and a second inverter with each of the inverters including at least three transistors are connected in series to form the buffer circuit. One of the three transistors in each inverter is driven by a delay circuit so that during a transition period of the CMOS inverter, simultaneous conduction of current through the CMOS inverter is prevented.

Another patent of interest is U.S. Pat. No. 4,567,385 entitled, "Power Switched Logic Gates", by S. L. Falater et al. The circuit embodiments of this patent solve the problem of current leakage by switchably connecting the low power terminal to the gates and inverter logic circuits to the high power terminal so that no voltage differential appears across the circuits in one logic state. The lack of a voltage differential in turn eliminates the flow of leakage current.

SUMMARY OF THE INVENTION

In one preferred embodiment of the invention a MOS inverter circuit having an input for receiving a bi-level input signal and an output for providing an inverted version of the input signal is connectable between a pair of power terminals. An additional inverter circuit has its input connected to the output of the MOS inverter circuit and it's output providing a control signal. A gating circuit couples and decouples the MOS inverter circuit to the source of power in response to the output signal from the inverter circuit so as to cut-off the current flow to the MOS inverter circuit when the control signal is of a first level. In a second embodiment of the invention a latching function is provided by connecting a feedback path from the output of the second inverter to a toggle gate circuit connected to the input to the MOS inverter circuit.

From the foregoing, it can be seen that it is a primary object of the present invention to provide a CMOS inverter circuit having no leakage current.

It is another object of the present invention to eliminate the use of PMOS transfer gates.

And it is another object of the present invention to decrease the surface area used to construct CMOS inverters of the type that utilize transfer gates for input signal use.

These and other object of the present invention will become more apparent when taken in conjunction with the following description and drawings wherein like characters indicate like parts and which drawings form a part of the present disclosure.

DESCRIPTION OF THE PREFERRED EMBODIMENTS

Figure 1:
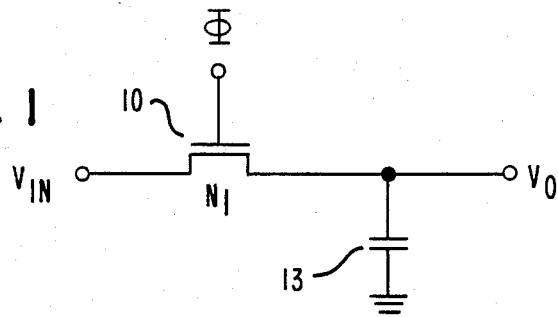
FIG. 1 is a circuit diagram illustrating a Prior Art, NMOS transfer gate feeding a capacitor 13 which represents the distributed capacitance of a CMOS inverter circuit.

Referring to the Prior Art circuit of FIG. 1, an N channel transfer gate 10 is formed with an NMOS transistor $N_1$ having its first and second current electrodes connected to an input terminal $V_{in}$ and an output labeled $V_o$, respectively. The control gate electrode of transistor $N_1$ receives the signal Phi, which may, in the on state, be equivalent to the power supply voltage $V_{DD}$. Current flows through the first and second current electrodes when the signal on the input terminal $V_{in}$ is equal to a logic "1" level and the signal Phi equals $V_{DD}$. The current flows from left to right to charge the capacitor 13 toward $V_{DD}$. As the voltage $V_o$ approaches $V_{DD}-V_{TN}$ or $V_{GS}=V_{TN}$, the transistor $N_1$ is turned off. The voltage $V_{TN}$ is the threshold voltage between the gate and the source electrode. The voltage $V_o$ remains at $V_{DD}-V_{TN}$ when the signal Phi is changed from $V_{DD}$ to 0 volts.

Figure 2:
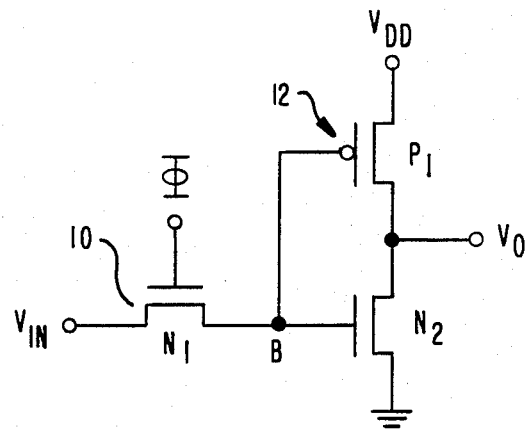
FIG. 2 is a circuit diagram of the prior art circuit of FIG. 1 with the capacitor replaced with a CMOS inverter.

Referring now to the Prior Art circuit of FIG. 2 wherein the capacitor 13 is replaced with a CMOS inverter 12 comprised of a P-channel transistor $P_1$ and an N-channel transistor, $N_2$.

The source of transistor $P_1$ is connected to a power source $V_{DD}$ and its drain is connected to the output terminal $V_o$. The drain of transistor $N_2$ is connected to the output terminal $V_o$ and its source is connected to a reference potential such as ground. The gate of transistors $P_1$ and $N_2$ are connected to a node point B (the output of transistor $N_1$).

Figure 3:
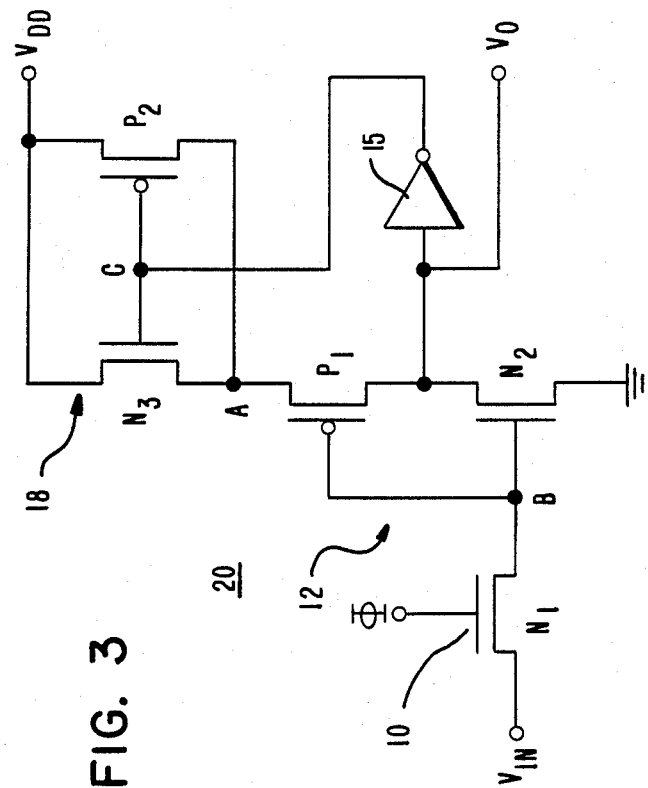
FIG. 3 is a circuit diagram illustrating one embodiment of the present invention.

The behavior of the PMOS transistor $P_1$ is described by the following drain-source current equations:

$I_{DSP} = 0 \; |V_{GS}| < |V_T|$, CUT-OFF $I_{DSP} = \tfrac{1}{2} B_p[2(V_{GS}-V_{TP})V_{DS}-(V_{DS})^2]$, LINEAR $I_{DSP} = \tfrac{1}{2} B_p(V_{GS}-V_{TP})^2$ where $V_{DS} < V_{GS}-V_{TP} < 0$ SATURATION with $V_{in} =$ "1" and $= V_{DD}$, a voltage $V_{DD}-V_{TN}$ appears at the node B $V_T = V_{TO} \pm K(V_{SB})^{\frac{1}{2}}$ for $P_1$ $V_{SB}=0$ thus $V_{TP}=V_{TPO}$
for $N_1$ $V_{SB}=3$ to 4 v therefore $V_{TN}$ is about $2V_{TNO}$
Typically $V_{TPO}= -0.8$ v; and
$V_{TNO}=0.7$ v
Since $V_{GSP}=V_B-V_{DD}= -V_{TN} < V_{TP}$
$V_{DSP} < V_{GSP}-V_{TP} < 0$
Saturation occurs in $P_1$, and the current is:
$I_{DSP} = \frac{1}{2}B_P(V_{GSP}-V_{TP})^2$
$= \frac{1}{2}B_P(V_B-V_{DD}-V_{TP})^2$ Referring to FIG. 3 wherein one embodiment 20 of the present invention is shown wherein a circuit 18 is interposed between the power terminal $V_{DD}$ and the CMOS inverter 12. The circuit 18 is comprised of a P channel transistor $P_2$ and an N channel transistor $N_3$. The control gates of $P_2$ and $N_3$ are connected to the output of an inverter 15 at a node point labeled C. The inverter's input is connected to the terminal $V_o$ and the transfer gate 10 remains unchanged from the FIG. 2 circuit.

In this design when $V_B=V_{DD}-V_{TN}$, $V_o=0$ and $V_C=V_{DD}$. $P_2$ is thus cut-off and $N_3$ is conducting. This causes the voltage at node A to be $V_A=V_{DD}-V_{TN}$ $V_{GSP1}=V_B-V_A=0$ $P_1$ is thus completely cut-off and a leakage current does not flow.

Figure 4:
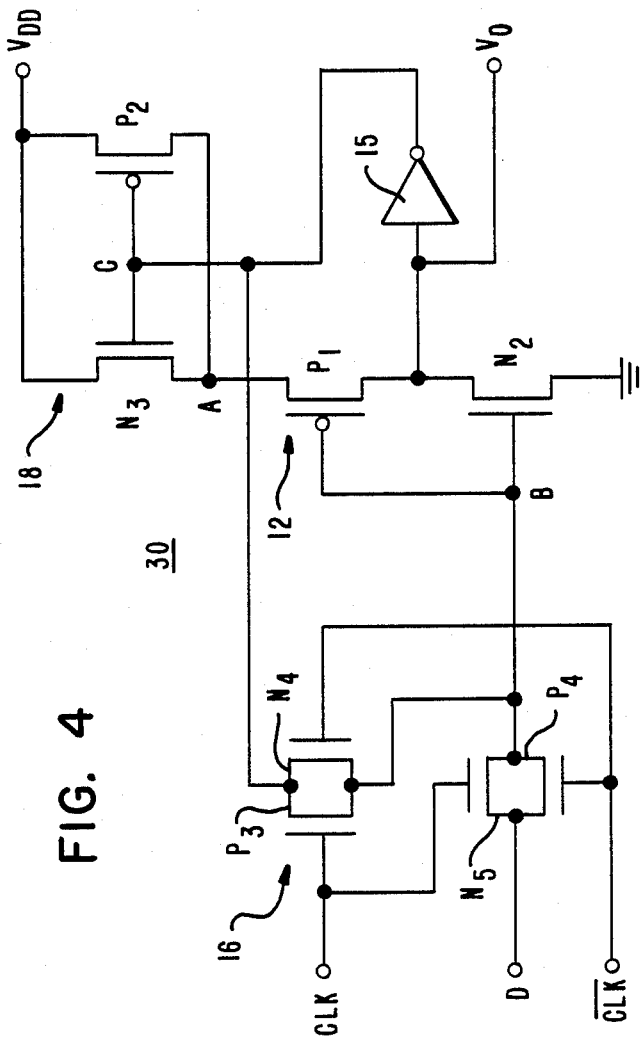
FIG. 4 is a circuit diagram illustrating a second embodiment of the present invention.

Referring now to FIG. 4 wherein is shown a second embodiment 30 of the present invention wherein the input transfer gate 10 is replaced with a circuit 16 so as to form a latch circuit.

The circuit 30 is comprised of N and P channel transistor pairs formed from transistors $N_4$ and $P_3$, and transistors $N_5$ and $P_4$. The signals CLK and $\overline{CLK}$ are applied to the gates of $P_3$, $N_5$ and $P_4$, $N_4$, respectively. Data to be latched by the circuit is applied to the input labeled D. The output of the inverter 15 is fed back to the circuits input (point B) via the connection to the transistors $P_3$ and $N_4$.

While there has been shown what is considered to be the preferred embodiments of the invention, it will be manifest that many changes and modifications may be made therein without departing from the essential spirit of the invention. It is intended, therefore, in the annexed claims, to cover all such changes and modifications that may fall within the true scope of the invention.

We claim:

1. A no-leak circuit comprising:
   a first MOS inverter circuit having an input for receiving a bi-level input signal and an output for providing an inverted input signal and a pair of power terminals for receiving power, one of said power terminals connected to a reference potential;
   a second inverter circuit having an input connected to the output of said first MOS inverter circuit and an output terminal; and
   circuit means for coupling the other power terminal of said first MOS inverter circuit to a source of power, said circuit means connected to the output of said second inverter circuit and responsive to the signal from said second inverter circuit for cutting off the current flow to said first MOS inverter circuit when the bi-level input signal is of a first level and for permitting the flow of current when said input signal is of a second level;
   wherein said circuit means comprises a P channel and an N channel transistor each having a control electrode and first and second current electrodes, said control electrodes connected to the output of said second inverter circuit and said first current electrodes connected to the other power terminal of said first MOS inverter and said second current electrodes connected to a source of power.

2. The no-leak circuit according to claim 1 wherein said first MOS inverter circuit is comprised of a P channel and an N channel transistor connected in series between the terminals for receiving power.

3. The no-leak circuit according to claim 2 wherein said P channel and said N channel transistor each have a control electrode, and first and second current electrodes, with said control electrodes connected to said input and said first and second current electrodes connected in series between the terminals for receiving power.

4. A no-leak circuit comprising:
   a CMOS inverter having an input for receiving a bi-level input signal and an output for providing an inverted input signal and power terminals for receiving power;
   an inverter circuit having an input connected to the output of said CMOS inverter and an output; and
   circuit means for coupling said CMOS inverter to a source of power, said circuit means connected to the output of said inverter circuit and responsive to the signal from said inverter circuit for cutting off the current flow to said CMOS inverter circuit when the bi-level input signal is of a first level and for permitting the flow of current when said input signal is of a second level;
   wherein said circuit means comprises a P channel and an N channel transistor each having a control electrode and first and second current electrodes, said control electrodes connected to the output of said inverter circuit and said first current electrodes connected to a power terminal of said first MOS inverter and said second current electrodes connected to a source of power.

5. The no-leak circuit according to claim 4 wherein said CMOS inverter circuit is comprised of a P channel and an N channel transistor connected in series between the terminals for receiving power.

6. The no-leak circuit according to claim 5 wherein said P channel and said N channel transistors each have a control electrode, and first and second current electrodes, with said control electrodes connected to said input and said first and second current electrodes connected in series between the terminals for receiving power.

* * * * *